United States Patent [19]

Quaranta

[11] Patent Number: 4,596,964
[45] Date of Patent: Jun. 24, 1986

[54] DIGITAL PHASE LOCKED LOOP

[75] Inventor: Carlo Quaranta, Villa Cortese, Italy

[73] Assignee: Italtel Societa Italiana Telecomunicazioni S.p.A., Milan, Italy

[21] Appl. No.: 684,045

[22] Filed: Dec. 20, 1984

[30] Foreign Application Priority Data

Dec. 23, 1983 [IT] Italy ............................. 24347 A/83

[51] Int. Cl.⁴ .............................................. H03L 7/08
[52] U.S. Cl. ..................................... 331/25; 331/1 A
[58] Field of Search ................. 331/1 R, 1 A, 17, 25, 331/32

[56] References Cited

U.S. PATENT DOCUMENTS 4,531,102 7/1985 Whitlock ............................. 331/1 A

OTHER PUBLICATIONS

IEE Transactions on Communications, vol. COM. 30, No. 10, Oct. 1982—pp. 2398-2411.
IEE Transactions on Communications, vol. COM. 28, No. 8, Aug. 1980, pp. 1343-1354; 1355-1364.
IEE Transactions on Communications, vol. COM. 26, No. 9, Sep. 1978—pp. 1355-1364.

*Primary Examiner*—Eugene LaRoche
*Assistant Examiner*—G. Wan
*Attorney, Agent, or Firm*—Karl F. Ross; Herbert Dubno

[57] ABSTRACT

The loop uses a phase comparator (PD) designed to compare the phase of a reference signal ($F_1$) with the phase of a signal generated locally ($F_2$) and also to make available on a first output (E) a signal expressing the entity of phase shift and on a second output (S) a signal expressing the sign of the phase shift ($F_1$ leading, or lagging, in respect to $F_2$). Thanks to the presence of this latter signal (S) it is possible to render the remaining units of the loop particularly simple and economic without having to make use of components that introduce in their turn limits in operational speed, excepting of course those imposed by the type of technology used. This loop is suitable to be conveniently implemented in an integrated manner.

11 Claims, 7 Drawing Figures

DIGITAL PHASE LOCKED LOOP

FIELD OF THE INVENTION

The present invention refers to a digital phase locked loop (DPLL) which has a linear type phase characteristic.

BACKGROUND OF THE INVENTION

Phase locked loops are mainly used in transmission systems of the syncronous type in order to generate a sequence of timing pulses the frequency of which is locked at the frequency of a reference signal. In the past this type of loop (circuit) was made mainly by adopting analogical type solutions which, over the last few years have become destined to be substituted by digital type solutions, due especially to the fact that the first sort tend to have problems of calibration, thermal drift, ageing of components and linearity, which are not to be found in the digital type solutions.

Therefore, digital phase locked loops have been studied and developed which mostly have a phase characteristic of a sinusoidal type.

This type of loop however, has the inconveniency that the phase error picked up by them is a function, not only of the phase shift between the reference signal and the signal generated locally, but also of the power of the reference signal (input signal). As a consequence, the value of said phase error may appear erroneously altered when the level of the input signal is susceptible to variations. In order to minimize the entity of said variations, the said solutions of the type already well known, include the use of a gain controlling amplifier (see Holly C. Osborne—IEEE Transaction on Communication—Vol. Com. 28 No. 8 August 1980—pages 1343-1363) which makes the said reference signal available on the output with a level of a predetermined entity and in any case without the aforementioned fluctuations. Said gain controlling amplifier is however an analogical type circuit which has the same calibration and drift problems as those illustrated above, and therefore makes the advantages gained from the presence of digital type solutions in the phase locked loop itself, all in vain.

In the IEEE magazine Transaction on Communication—Vol. Com. 30 No. 10 October 1982—pages 2398-2411, a digital phase locked loop is illustrated which is therein indicated with the title "Digital Tanlock Loop", which has a phase characteristic of linear type in order to make the loop's operation insensitive to variations in the level of the input signal. However, the loop therein described has a linearity field of a limited entity (from $-\pi$ to $+\pi=2\pi$) and its implementation requires the use of sampling circuits or loops and of an analog-digital converter, which in turn have the inconveniencies described above with reference to analogical systems and phase locked loops with sinusoidal type phase characteristics. Furthermore, said type of unit limits the operational speed of the phase locked loop as it is not possible to operate with high frequency signals.

OBJECT OF THE INVENTION

The aim of the present invention is to produce a digital phase locked loop having a linear phase characteristic in a much wider field ($-2\pi$ to $+2\pi=4\pi$), without having to use components which present the typical inconveniencies of analog components or which introduce limits in operational speed. A further aim is to individuate solutions to make the loop's hardware particularly simple as well as being implementable in an integrated form.

SUMMARY OF THE INVENTION

For this purpose the phase locked loop, object of this invention, includes the presence in combination of the following characteristic elements:

a phase comparator designed to compare the phase of a first signal (reference signal) with the phase of a second signal (signal generated locally), and also to make available on a first output a signal expressing the sign of the frequency shift and on a second output a signal expressing the entity of the phase shift;

counting means, connected to the first and second output of the phase comparator and fed by a sequence of timing pulses at high frequency (with respect to the frequency of said first signal), designed to convert the duration of each of the pulses present on the second output of the phase comparator into digital form;

digital filtering means, designed to receive on their input the first and the second output of the phase comparator, as well as the output of the counting means, and also designed to make available on their output a binary configuration expressing the control signal for a digital control oscillator;

a digital control oscillator constituted by a computer designed to receive on its present inputs the said control signal provided by the filtering means and on its counting input the said sequence of timing pulses, and furthermore, designed to output the said second signal.

All the means listed above may be implemented with purely digital units and do not have limits in operational speed, excepting those imposed by the type of technology adopted. Furthermore, thanks to the use of a phase comparator designed to output both the entity and the sign of the shifting, the hardware of the counting means and the filtering means is noticeably simplified with respect to the corresponding units used in other solutions of known types.

BRIEF DESCRIPTION OF THE DRAWING

These and other characteristics of the invention will be made clearer by the following description which refers to a non-limiting example and is complete with the attached diagrams in which.

SPECIFIC DESCRIPTION

Figure 1:
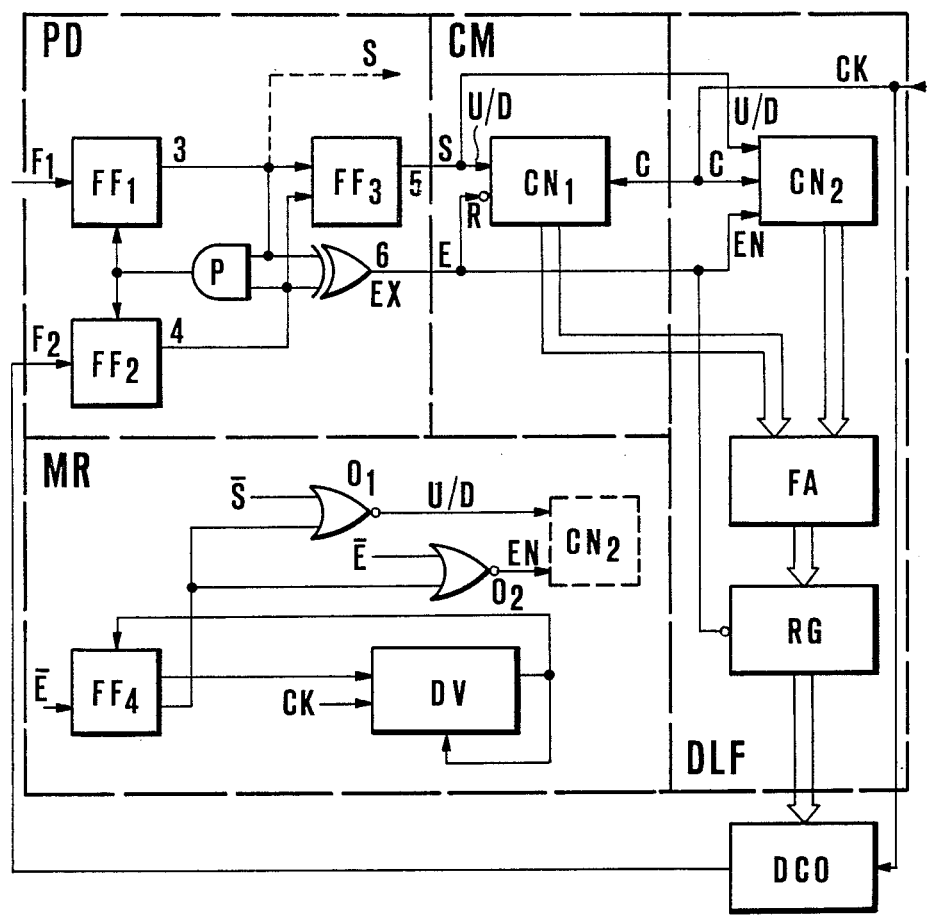
FIG. 1 shows the block diagram of the phase locked loop made according to the invention.

The block diagram shown in FIG. 1 includes a phase detector PD which receives on its first input a signal $F_1$ constituting the reference signal, and on its second input a signal $F_2$ constituting the signal generated locally. Said signals reach the timing input of their respective D type bistable circuit $FF_1$ and $FF_2$ which have their data input continuously connected to a reference potential.

The outputs from the units $FF_1$ and $FF_2$ are input into an exclusive logical sum unit EX, as well as being input into a logical product unit P. This latter unit has its output connected to the reset input of the $FF_1$ and $FF_2$ units. The output from the $FF_1$ unit also comes onto the data input of another D type bistable circuit $FF_3$, which receives the output of the $FF_2$ unit on its timing input.

Figure 2A:
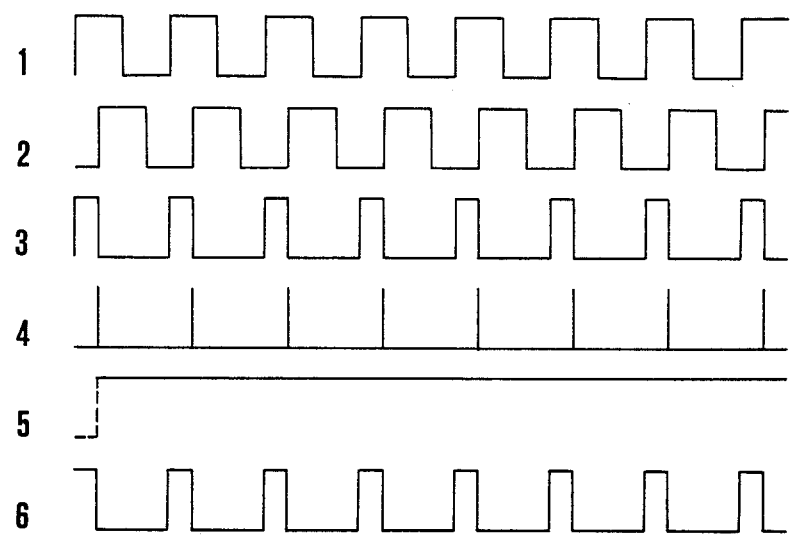
FIG. 2 shows wave forms referring to FIG. 1.
Figure 2B:
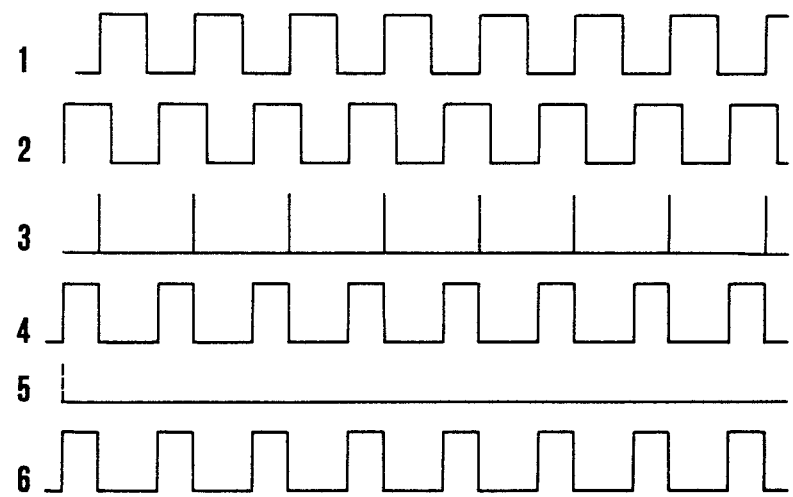

In FIG. 2, diagrams 1 and 2, the said signals $F_1$ and $F_2$ are illustrated, and in particular in FIG. 2a the signal $F_1$ leading on the signal $F_2$ is illustrated, whilst in FIG. 2b the opposite solution is taken into consideration.

In diagrams 3 and 4, on the other hand, the waveforms corrisponding to the output from the $FF_1$ and $FF_2$ units are illustrated, whilst in diagram 5 and 6 the waveforms corrisponding respectively to the outputs from the $FF_3$ and EX units are illustrated.

From an examination of the waveforms shown in FIG. 2a and FIG. 2b it becomes evident that a sequence of pulses the duration of which expresses the entity of the phase shift between the sequence $F_1$ and the sequence $F_2$ corrisponds with the output from the EX unit (diagram 6). Whilst a logical level "0" in the case of the opposite situation occuring (diagram 5b): therefore, the logical level of the $FF_2$ output expresses the sign of the phase shift.

It is to be noted that the presence of the bistable circuit $FF_3$ can be considered superfluous in the great majority of cases in as much as the information concerning the sign S of the phase shift can be picked up on the output from the $FF_1$ unit.

The presence of the $FF_3$ unit is necessary solely when the circuits that follow after have a very high operational speed, and in any case that is high enough to pick up the presence of the pulses (very narrow) illustrated in diagram 3 of FIG. 2b.

The output from the phase comparator PD is input into counting means CM designed to convert into numerical form each of the pulses of sequence 6 which corrisponds to the output from the EX unit. Thanks to the adoption of a phase comparator PD that provides both the sign and the entity of the phase shift the said counting means can be implemented by means of a simple up-down counter $CN_1$; this latter unit receives on its counting input C a sequence of timing pulses CK at very high frequency (in relationship to the frequency of the input signal $F_1$), on its reset input R the output of the EX unit ($CN_1$ starts counting, or else is reset, when the output from the EX unit is active, or else nonactive), and on its counting direction control input U/D the output from the $FF_3$ unit (or $FF_1$ if $FF_3$ is missing).

In correspondence with each phase comparison carried out by the PD unit, the $CN_1$ unit outputs a binary configuration expressing the entity of the phase shift measured. Said configuration is input into the digital filter of the ring DLF which utilizes a particularly simple and economical storage unit. In fact, in order to carry out the aforesaid filtering, it is necessary to store the results from the phase measurements carried out previously, before the one actually being carried out, as well as the algebraical sum of the entity measured against the stored entity. Thanks to the use of the said PD unit designed to output the phase shift sign, the function described above can easily be implemented by means of a further up-down counter $CN_2$. In the already known sorts of unit, on the other hand, implementation of this function necessitates the use of memory organs and of an arithmetical and logical unit ALU which carry out the aforementioned adding and storage functions. The $CN_2$ unit (on the contraty to the $CN_1$ unit), is never reset in as much as the output from the EX unit in this case is input into the start counting qualification input EN; therefore, the $CN_2$ unit counts either up, or down, (in relationship to the logical level of the signal S), the pulses of the CK sequence, during the instants in which the pulses output from the EX unit qualify it to start counting. Furthermore, the digital filter also includes the presence of an adder circuit FA designed to receive on its input the numbers available on the outputs of the $CN_1$ and $CN_2$ units, as well as to sum said number and input the result to a register RG; this latter memorizes the output of the digital filter during the instants in which disactivation of the EX unit's output is registered. A digital word is available on the output of the RG unit which tends to modify the phase of the locally generated signal unit it coincides with that of the reference signal. In fact, the output from the digital filter DLF is input into a digitally controlled oscillator DCO which receives the said sequence of pulses CK and outputs the $F_2$ signal.

The DCO unit can be implemented by means of a presettable counter which after each phase comparison receives the output signal of the digital filter DLF, automatically presetting itself at the end of each count. As a consequence of this, the DCO unit modifies the phase of the signal corresponding to its own output, in as much as the instant in which its own counting cycle finishes is modified.

Figure 3:
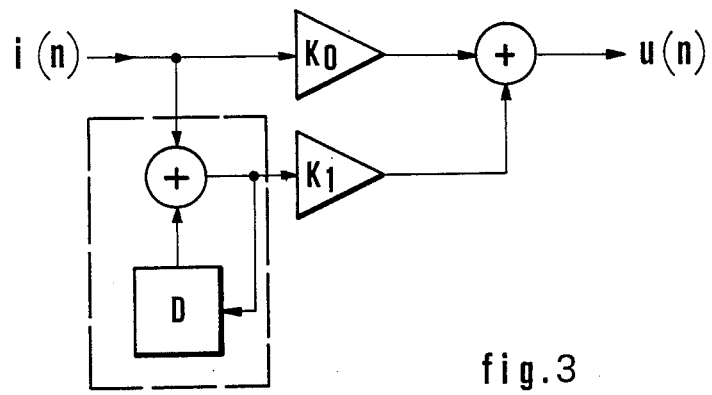
FIG. 3 shows the basic diagram of the digital filter DLF in FIG. 1.
Figure 4:
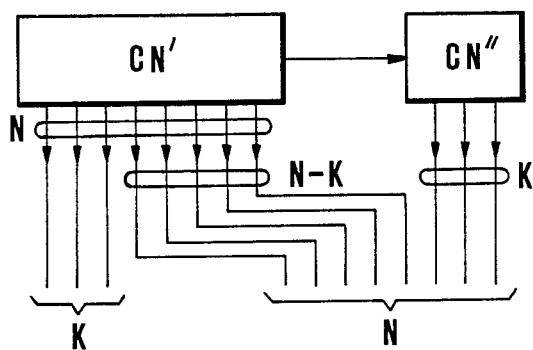
FIG. 4 shows one way of making the counters $CN_1$ or $CN_2$ in FIG. 1.

The structure of the DLF unit described above is designed for the implementation of a second order filter, the basic diagram of which is represented in FIG. 3. In this diagram the input signal i(n) reaches the storage organ of the filter, therein represented by an adder circuit and a memory element D, and implemented in FIG. 1 by means of the unit $CN_2$. The signal i(n) also reaches an element $K_0$ designed to effect a multiplication function that is necessary in order to effect the filtering function. A second multiplication element is indicated with $K_1$ and is connected to the output of the accumulator; the outputs of the elements $K_0$ and $K_1$ are input into an adder which is implemented in FIG. 1 by means of the unit FA. It must be noted that the invention makes it possible to carry out a further simplification in respect to loops of the known type, in as much as the elements $K_0$ and $K_1$ are implemented through the counters $CN_1$ and $CN_2$; these latter are really made up of just as many counting chains, one of which is shown in the diagram in FIG. 4. Said structure is designed to carry out the multiplication function mentioned above in as much as it includes a first section CN' with N outputs, K of which referring to the least significant bit are neglected. Another section CN" with K outputs is cascade connected to the section CN'. It can be shown that the number K of the neglected least significant bits defines the multiplication factor of the filter and in the end the cutoff frequency of the filter. The most significant N-K outputs of the section CN' together with the K outputs of the section CN" are input into the adder circuit FA.

Figure 5:
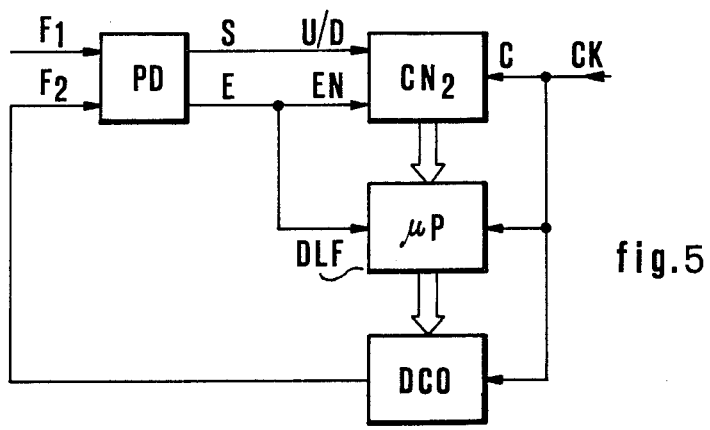
FIG. 5 shows another version of the DLF unit in FIG. 1.

Implementation of a first order filter is noticeably simplified with respect to the structure described above in as much as it does not require the units $CN_2$ and FA to be present, and consequently the $CN_1$ unit is connected directly in input to the RG unit. Therefore the invention allows implementation of the multiplication function by means of counting chains which are much simpler and more economical than the multiplication circuits used in the known types of system. On the basis of a further form of realization of the invention, the digital filter DLF can be implemented by means of a microprocessor system μP as is shown in FIG. 5. The unit μP carries out a cycle of operations after each phase measurement carried out by the unit PD (pulses illustrated in diagram 6 of FIG. 2). Said cycle includes the processing of the binary configuration available on the output of the unit $CN_2$ (or $CN_1$, and in this case μP carries out the storage function usually carried out by $CN_2$ within itself), in order to make the numerical (digital) control signal of the DCO unit available.

Delaying means MR are also shown in FIG. 1 which are not absolutely essential to the circuit's operation although their presence is in some case advantageous in as much as it gives greater operational stability to the circuit. The presence of said means MR is however particularly useful when the DPLL loop is used to make a sequence of timing pulses available that is phase locked to an input signal $F_1$ modulated for example according to a code of the two-phase type; said coding forsees sending into the line levels 0-1 when the binary signal has a logical level ∅, and sending on levels 1-0 when the binary signal has a logical level 1. In the known types of DPLL loops the abovementioned stability problems are resolved by inserting a multiplier circuit into the ring (see Holly C. Osborne in the aforementioned document—page 1359). However said unit is not easily implemented so the invention includes the presence of means designed to delay the signal $F_2$ by means of using particularly simple and economical circuital solutions which are also designed to easily vary the entity of the delay.

According to this invention the delay of the signal $F_2$ may easily be obtained by acting on the filtering unit DLF, and in particular on its storage organ which in this case is constituted by the $CN_2$ unit. The said delaying means MR are made up basically by a dividing organ DV (for example of the programmable type), which at the end of each phase comparison decreases the entity accumulated by $CN_2$ by a predetermined number of steps which is in any case linked to the entity of delay desired to be obtained. By using a DV unit of the programmable type it is possible to obtain a delay, for example of $\pi/2$, which if required can easily be varied by modifying the programming of the DV unit; furthermore the programmed entity remains constant even with the varying of the frequency of the input signal. The MR means also include the presence of a D type bistable circuit $FF_4$ which receives on its timing input the said signal E inverted and has its data input constantly connected to a reference potential. Operation of the DLF unit remains unaltered as far as the carrying out of each phase measurement is concerned (said measurement is taken during each pulse of the sequence E). The decreasing operation described above is started as from the transition "1"→"0" of each pulse of the sequence E, in as much as said transition determines the switching of the $FF_4$ unit, which in turn qualifies the DV unit to carry out the division of the CK sequence.

A logical level ∅ corresponds to the inverted output of the $FF_4$ unit, which through a first logical sum unit $O_1$, determines qualification for counting of the $CN_2$ unit (EN signal); furthermore, this latter unit receives on its counting direction control input (U/D signal) the level forseen for counting backwards, through a logical sum unit $O_2$.

Therefore the $CN_2$ unit decreases its own contents by an entity determined by the DV unit; in fact activation of the output of said unit causes the reset of the $FF_4$ unit which, by means of the $O_2$ unit, qualifies the $CN_2$ unit during the time in which the output of the EX unit is not active. It can be shown that by decreasing the entity accumulated by $CN_2$ by a predetermined number of steps, we can obtain the effect of delaying the signal $F_2$ by an entity linked to the aforesaid number of steps.

Figure 6:
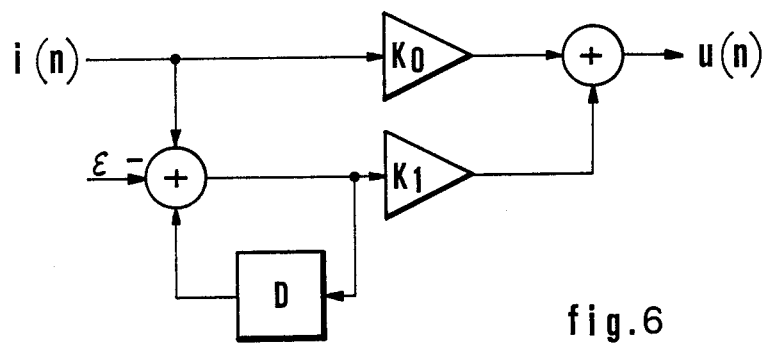
FIG. 6 shows the same diagram as FIG. 3 but modified in accordance with the presence of the MR means in FIG. 1.

By completing the phase locked loop with the delaying means described above, the basic diagram of the digital filter DLF in FIG. 3 is modified as illustrated in FIG. 6. In said figure the size ε indicates the entity by which the contents of the accumulator are decreased and in the end the entity of the delay shown by the signal $F_2$ in respect to $F_1$. Following up all that has been described above, it soon becomes evident that the loop of this invention is implementable with particularly simple and economical units which do not create any limits in operational speed, excepting those that are typical of the type of technology with which said units have been produced. If the said units are made in ECL technology, the loop is suitable to operate at frequencies in the order of about a hundred MHz. It must be kept in mind that the value of the operating frequency affects the degree of definition of the measurements carried out. In fact the loop is designed to measure phase shifts of an entity that is not less that the period of the said CK sequence and consequently, the higher the operating frequency is, the higher is the degree of definition. Therefore, by producing the loop with a technology that makes it possible to reach high operation speeds it is possible to carry out measurements with a particularly high degree of definition. It must also be borne in mind that the value of said operational frequency, also influences the jitter associated to the signal $F_2$, as well as the abovementioned degree of definition. The pulses of the sequence $F_2$ are infact subject to jitter, the entity of which is a function of the relationship between the frequency of the said CK sequence and the frequency of the input signal (see D'Andrea and Russo—IEEE Transaction on Communication—Vol. Com. 26—No. 9, September 1978—pages 1355-1364). For example, by adopting a CK signal with a frequency of 1024 KHz and an input signal with a frequency of 4 KHz, the result is that the jitter associated to the pulses of the $F_2$ sequence is of about 2.8 degrees. Therefore by adopting an operating frequency of a high value it is possible to obtain a jitter of the entity described above, the negative effects of which may be considered negligible. Furthermore, the loop has a linear phase characteristic in a particularly wide field (from $+2\pi$ to $+2\pi=4\pi$), in accordance with the established purpose of the invention.

It is possible, without overstepping the limits of the invention, to connect a digital analog convertor to the output of the DLF unit (not illustrated), and substitute the DCO unit with a voltage controlled unit. This latter implementation can be useful when the $F_2$ signal must have a high frequency.

What is claimed is:

1. Digital phase locked loop, characterized by the fact that it includes:
    a phase comparator (PD) designed to compare the phase of a first signal ($F_1$) with the phase of a second signal ($F_2$), and also designed to make available on a first output (S) a signal expressing the phase shift sign, and on a second output (E) a signal expressing the entity of the phase shift;

counting means (CM), connected to the first and second output of the phase comparator (S and E), and fed by a sequence of timing pulses (CK), designed to convert into digital form the duration of each of the pulses present on the second output (E) of the phase comparator (PD);

a digital filtering means (DLF), designed to receive an input the first and second output of the phase comparator (PD) as well as the output of the counting means (CM), and also designed to output a binary configuration expressing the control signal of a digitally controlled oscillator (DCO);

a digitally controlled oscillator (DCO) constituted by a counter designed to receive on its preset inputs the said control signal provided by the filtering means (DLF) and on its counting input the said sequence of timing pulses (CK).

2. Digital phase locked loop as described in claim 1 characterized by the fact that the said phase comparators (PD) comprises:

a first and a second D type bistable circuit ($FF_1$ and $FF_2$) having their data input connected to a fixed potential and also having their timing input respectively fed by said first and said second signal ($F_1$, $F_2$);

a logical product circuit (P) designed to receive as input the outputs of the first and the second bistable circuits ($FF_1$ and $FF_2$), and also designed to send its output signal onto the reset inputs of the same bistable circuits ($FF_1$, $FF_2$); and an exclusive logical sum circuit (EX) having its inputs connected to the outputs of the first and second bistable circuit ($FF_1$, $FF_2$), wherein output of said exclusive logical sum circuit being a signal expressing entity of the phase shift.

3. Digital phase locked loop as described in claim 2 characterized by the fact that it includes a third D type bistable circuit ($FF_3$), having its data input and timing input respectively connected to the output of the first and the second bistable circuit ($FF_1$, $FF_2$), wherein output of said third D type bistable circuit being a further signal expressing polarity of the phase shift.

4. Digital phase locked loop as described in claim 1 characterized by the fact that the said counting means (CM) are constituted by a first up-down counter ($CN_1$) which receives on its counting input (C) the said sequence of timing pulses (CK), on its counting direction control input (U/D) and on its reset input (R) the first and respectively second output of the phase comparator (PD).

5. Digital phase locked loop as described in claim 4 characterized by the fact that the said digital filtering means (DLF) are constituted by a microprocessor system (μP) designed to receive on its interrupt input the second output (E) of the phase comparator (PD) and on its data input the output of said first up-down counter ($CN_1$), and also designed to make available the numerical control signal of the digitally controlled oscillator (DCO).

6. Digital phase locked loop as described in claim 1 characterized by the fact that the said digital filtering means (DLF) implement a second order filter and include the presence in combination of the following characteristic elements:

a second up-down counter ($CN_2$) which receives on its counting input the said sequence of timing pulses (CK), on its counting direction control input (U/D) and on its start counting input, the first and respectively second output (S, E) of the phase comparator (PD);

an adder circuit (FA) designed to sum the numbers available on the output of the first and second up-down counter ($CN_1$ and $CN_2$); and a register (RG) designed to memorize the number that corresponds to the output of the adder circuit (FA) when the second output (E) of the digital filter (PD) is not active.

7. Digital phase locked loop as described in claim 5 characterized by the fact that it includes the presence of delay means (MR), the input of which is connected to the output of the said phase comparator (PD) and the output of which inputs into the said digital filter (DLF), designed to delay by a predetermined entity the said second signal ($F_2$), thus determining the decrease of the contents of the second counter ($CN_2$) by a number of steps that is a function of the aforementioned entity.

8. Digital phase locked loop as described in claim 8 characterized by the fact that the said delay means (MR) include the presence in combination of the following characteristic elements:

a fourth D type bistable circuit ($FF_4$) having its data input connected to a fixed potential and also having its timing input connected to the said second output (E) of the phase comparator (PD);

a frequency divider (DV), fed by the said sequence of timing pulses (CK) and qualified by the said fourth bistable circuit ($FF_4$), the output of which is connected to the reset input of the fourth bistable circuit ($FF_4$); and a first and a second logical sum circuit ($O_1$, $O_2$) having their first input connected to the output of the fourth bistable circuit ($FF_4$), their second input connected respectively to the first and second output ($\bar{S}$ and $\bar{E}$) of the phase comparator (PD), and their outputs connected respectively to the counting direction control input and to the qualifying input of the second counter ($CN_2$).

9. Digital phase locked loop as described in claim 5 characterized by the fact that the said first and second counter ($CN_1$, $CN_2$) include a first section (CN') having a counting capacity of $2^N$ in cascade to which is connected a second section (CN'') having a counting capacity of $2^K$, as well as by the fact that the outputs of each counter are obtained by associating the N - K outputs concerning the most significant bits of the said first section (CN') to the K outputs of the said second section (CN'').

10. Digital phase locked loop as described in claim 6 characterized by the fact that the said digital filtering means (DLF) are constituted by a microprocessor system (P) designed to receive on its interrupt input the second output (E) of the phase comparator (PD) and on its data input the output of said second up-down counter ($CN_2$), and also designed to make available the numerical control signal of the digitally controlled oscillator (DCO).

11. Digital phase locked loop as described in claim 1 characterized by the fact that the said digital filtering means (DLF) implement a first order filter and are constituted by a register (RG) designed to memorize the number that corresponds to the output of the counting means (CM) when the second output (E) of the phase comparator (PD) is not active.

* * * * *